US 8,952,688 B2

(12) United States Patent
Nakajima et al.

(10) Patent No.: US 8,952,688 B2
(45) Date of Patent: Feb. 10, 2015

(54) CURRENT DETECTOR

(75) Inventors: Hirokatsu Nakajima, Mie (JP); Satoru Chaen, Mie (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 0 days.

(21) Appl. No.: 14/128,417

(22) PCT Filed: Feb. 2, 2012

(86) PCT No.: PCT/JP2012/052338
§ 371 (c)(1),
(2), (4) Date: May 9, 2014

(87) PCT Pub. No.: WO2013/005449
PCT Pub. Date: Jan. 10, 2013

(65) Prior Publication Data
US 2014/0239947 A1    Aug. 28, 2014

(30) Foreign Application Priority Data

Jul. 5, 2011   (JP) .................................. 2011-148768

(51) Int. Cl.
*G01R 19/00*   (2006.01)
*G01R 15/20*   (2006.01)
(52) U.S. Cl.
CPC ............ *G01R 19/0092* (2013.01); *G01R 15/20* (2013.01); *G01R 15/207* (2013.01)
USPC .................... 324/251; 324/117 H; 324/117 R; 324/126; 324/127; 324/252
(58) Field of Classification Search
None
See application file for complete search history.

(56) References Cited

U.S. PATENT DOCUMENTS

| 7,692,526 | B2 * | 4/2010 | Hundt ........................... 336/192 |
| 2006/0119343 | A1 * | 6/2006 | Saito et al. ................ 324/117 H |
| 2009/0278526 | A1 | 11/2009 | Yoshida |

FOREIGN PATENT DOCUMENTS

| JP | A-7-320627 | 12/1995 |
| JP | A-10-104279 | 4/1998 |
| JP | A-2003-45231 | 2/2003 |
| JP | A-2006-166528 | 6/2006 |
| JP | A-2009-58451 | 3/2009 |
| JP | A-2009-128116 | 6/2009 |
| JP | A-2009-270910 | 11/2009 |

OTHER PUBLICATIONS

Apr. 24, 2012 International Search Report issued in International Patent Application No. PCT/JP2012/052338.

* cited by examiner

*Primary Examiner* — Melissa Koval
*Assistant Examiner* — Stephen G Armstrong
(74) *Attorney, Agent, or Firm* — Oliff PLC

(57) ABSTRACT

A current detection busbar has a penetrating portion that penetrates a hole portion of a magnetic core and two flat plate-like terminal portions that are respectively continuous with opposite sides of the penetrating portion. The terminal portions have a larger width and a smaller thickness than the penetrating portion. An insulating casing has busbar holes that are penetrated by the respective terminal portions of the current detection busbar. An edge portion of each busbar hole is constituted by flat surfaces that face the terminal portion with a gap left between each flat surface and the terminal portion, a plurality of projecting portions that sandwich the terminal portion while coming into contact with the front and back surfaces of the terminal portion, and curved surfaces that face respective corner portions of the terminal portion with a gap left between each curved surface and the corresponding corner portion.

2 Claims, 5 Drawing Sheets

CURRENT DETECTOR

This application is the national phase of PCT International Application No. PCT/JP2012/052338 that has an International filing date of Feb. 2, 2012 and designated the United States of America and claims priority to Japanese Patent App. No. JP 2011-148768 that was filed on Jul. 5, 2011. The disclosure of the prior applications is hereby incorporated by reference herein in their entirety.

BACKGROUND

Vehicles such as hybrid automobiles or electric automobiles in many cases include a current detector for detecting a current that flows through a busbar connected to a battery. Examples of apparatuses that may be applied as such a current detector include a magnetic proportion-type current detector and a magnetic balance-type current detector.

A current detector of a magnetic proportion type or a magnetic balance type includes a magnetic core and a magneto-electric conversion element, for example, as shown in JP H10-104279A, JP 2006-166528A, and JP 2009-58451A. The magnetic core is a magnetic material substantially in the shape of a ring with a gap portion, resulting in two ends facing each other across the gap portion, and formed in one piece so as to surround a hole portion penetrated by a busbar. The hole portion of the magnetic material is a space (current detection space) through which a current that is to be detected flows.

Further, in the conventional current detector, the magnetic core has a structure obtained by a plurality of thin plate-like members that each have substantially the shape of a ring and are made from a magnetic material being stacked one on the other via an adhesive agent. Hereinafter, the magnetic core having such a structure is referred to as a stacked-type magnetic core.

The magneto-electric conversion element is disposed in the gap portion of the magnetic core. The magneto-electric conversion element is an element that detects a magnetic flux that changes in accordance with a current that flows through the busbar penetrating the hole portion, and then outputs a detection signal of the magnetic flux as an electrical signal. As the magneto-electric conversion element, typically, a Hall element is used.

In a current detector, the polarity of the detection signal of the magneto-electric conversion element depends on the direction of the current that passes through the hole portion of the magnetic core. For this reason, the current detector needs to be disposed in a proper orientation that is predetermined with respect to the direction of the current flowing through the busbar.

As disclosed in JP 2009-128116A, in current detectors, the magnetic core and the magneto-electric conversion element are often supported in a fixed positional relationship by an insulating casing. The casing positions a plurality of components constituting a current detector in a fixed positional relationship. Note that generally the casing is composed of an insulating resin member.

SUMMARY

Technical Problem

In some current detectors, since a plate-like busbar is inserted into a hole portion of a magnetic core, the magnetic core needs to be configured such that the maximum width (or diameter) of the hole portion is larger than the width of the busbar. However, electric automobiles, hybrid automobiles, and the like employ more and more a wide and thin busbar in order to prevent the busbar from excessively generating heat associated with an increase in a current that flows through the busbar.

Accordingly, the current detector has a problem that the wider the busbar is, the larger the magnetic core that is required in proportion to the width of the busbar. This problem leads to a larger space in which the current detector is installed. In particular, in the case where the magnetic core is in the shape of a circular ring, an elliptical ring, or a rectangular ring in which the ratio of the longitudinal length to the lateral length is 1 or approximately 1, a wasted space in the hole portion of the magnetic core increases as the width of the busbar increases.

In addition, even though a wide and thin busbar exhibits excellent heat dissipation, in the case where through holes in the form of narrow slots that are to be penetrated by such a thin busbar are formed in the casing of the current detector, corner portions at both ends of each through hole in the form of a slot are likely to crack due to stress concentration. Note that with regard to resin molded members, it is known that corner portions at both ends of a through hole in the form of a narrow slot are likely to crack due to stress concentration.

On the other hand, in the case where through holes having such a large thickness that a gap is formed between each through hole and the busbar and having no corner portions are formed in the casing of the current detector, edge portions of the through holes are unlikely to crack. However, current detectors that are installed in vehicles are subjected to vibrations from the vehicles. Thus, if through holes having a large thickness relative to the busbar are formed in the casing, the edge portions of the through holes of the casing and the busbar frequently collide due to the vibrations, resulting in the problems of the generation of an unusual sound and the wearing down of the casing.

It is an object to provide a current detector for detecting a current that flows through a busbar, in which it is possible to achieve both downsizing of the current detector by employing a relatively small magnetic core in relation to the width of the busbar, and prevention of malfunctioning due to excessive heat generation of the busbar and vibrations.

Solution to Problem

A current detector is provided for detecting a current that flows through a busbar, and includes the following constituent components:

(1) a first constituent component is a magnetic core that is made of a magnetic material and formed in one piece so as to surround a hole portion, two ends of the magnetic core facing each other across a gap portion;

(2) a second constituent component is a magneto-electric conversion element that is disposed in the gap portion of the magnetic core and detects a magnetic flux that changes in accordance with a current that passes through the hole portion of the magnetic core;

(3) a third constituent component is a current detection busbar that is composed of a conductor including a penetrating portion that penetrates the hole portion of the magnetic core and two flat plate-like terminal portions that are respectively continuous with opposite sides of the penetrating portion in a direction in which the penetrating portion penetrates the hole portion, the terminal portions of the current detection busbar having a larger width and a smaller thickness than the penetrating portion; and (4) a fourth constitutional element is an insulating casing that supports the magnetic core, the magneto-electric conversion element, and the penetrating portion of the current detection busbar in a fixed positional relationship while covering the magnetic core, the magneto-electric conversion element, and the penetrating portion of the current detection busbar in a state in which the two terminal portions are exposed to the outside, the insulating casing being constituted by two casing constituents that are combined with each other from opposite sides of the magnetic core, the two casing constituents each having a busbar hole that is penetrated by the corresponding terminal portion of the current detection busbar, and an edge portion of the busbar hole being constituted by flat surfaces that face the terminal portion with a gap left between each of the flat surfaces and the terminal portion, a plurality of projecting portions that project from the flat surfaces and sandwich the terminal portion while coming into contact with a front surface and a back surface of the terminal portion, and curved surfaces that face respective corner portions of the terminal portion with a gap left between each of the curved surfaces and the corresponding corner portion.

Moreover, in the current detector, it is conceivable that the current detection busbar is a member having a structure in which both end portions of a rod-shaped metal member that is capable of penetrating the hole portion of the magnetic core are shaped by press working into a flat plate-like shape that is wider than other portions of the rod-shaped metal member, and the two shaped end portions constitute the two terminal portions.

Advantageous Effects

In the current detector, the two end portions of the current detection busbar serve as the terminal portions. The current detection busbar penetrating the hole portion of the magnetic core can be joined to pre-installed upstream and downstream busbars. Thus, it is possible to employ a current detection busbar having a specific shape that is different from the shape of the upstream and downstream busbars, and this makes it possible to employ a small magnetic core without being restricted by the width of the upstream and downstream busbars.

Moreover, in the current detection busbar, the penetrating portion that penetrates the hole portion of the magnetic core is formed so as to have a large thickness relative to the terminal portions that are respectively located upstream and downstream of and are continuous with the penetrating portion. Thus, this penetrating portion can be configured so as to have a larger cross-sectional area, with the restriction that the width and thickness of the penetrating portion are smaller than the width of the hole portion of the magnetic core. Therefore, even in the case where a relatively small magnetic core is employed, it is possible to prevent the current detection busbar from excessively generating heat.

The busbar holes of the insulating casing have such a large thickness that a gap is formed between each busbar hole and the corresponding terminal portion of the current detection busbar, and have no corner portions. Thus, in the edge portions of the busbar holes of the insulating casing, cracking due to stress concentration is unlikely to occur.

The plurality of projecting portions are formed at the edge of each busbar hole of the insulating casing, the projecting portions sandwiching the corresponding terminal portion of the current detection busbar while coming into contact with the front and back surfaces of that terminal portion. Thus, the edge portions of the busbar holes of the insulating casing and the terminal portions of the current detection busbar do not collide even in an environment in which they are subjected to vibrations, and the generation of an unusual sound and the wearing down of the casing are avoided.

Moreover, it is preferable if the current detection busbar is a member having a structure in which the end portions of the rod-shaped metal member that is capable of penetrating the hole portion of the magnetic core are shaped by press working into a flat plate-like shape that is wider than the other portions of the rod-shaped metal member. In this case, flat plate-like terminal portions that are wider and thinner than the width of the hole portion of the magnetic core can be easily made at the two end portions of the rod-shaped metal member that does not have a plate-like shape. Note that the rod-shaped metal member may be, for example, a metal member having a cylindrical shape or a prism shape.

DETAILED DESCRIPTION OF THE EMBODIMENTS

Hereinafter, an embodiment will be described with reference to the appended drawings. The following embodiment is merely a specific example of the invention, and is not to restrict the technical scope of the invention.

Figure 1:
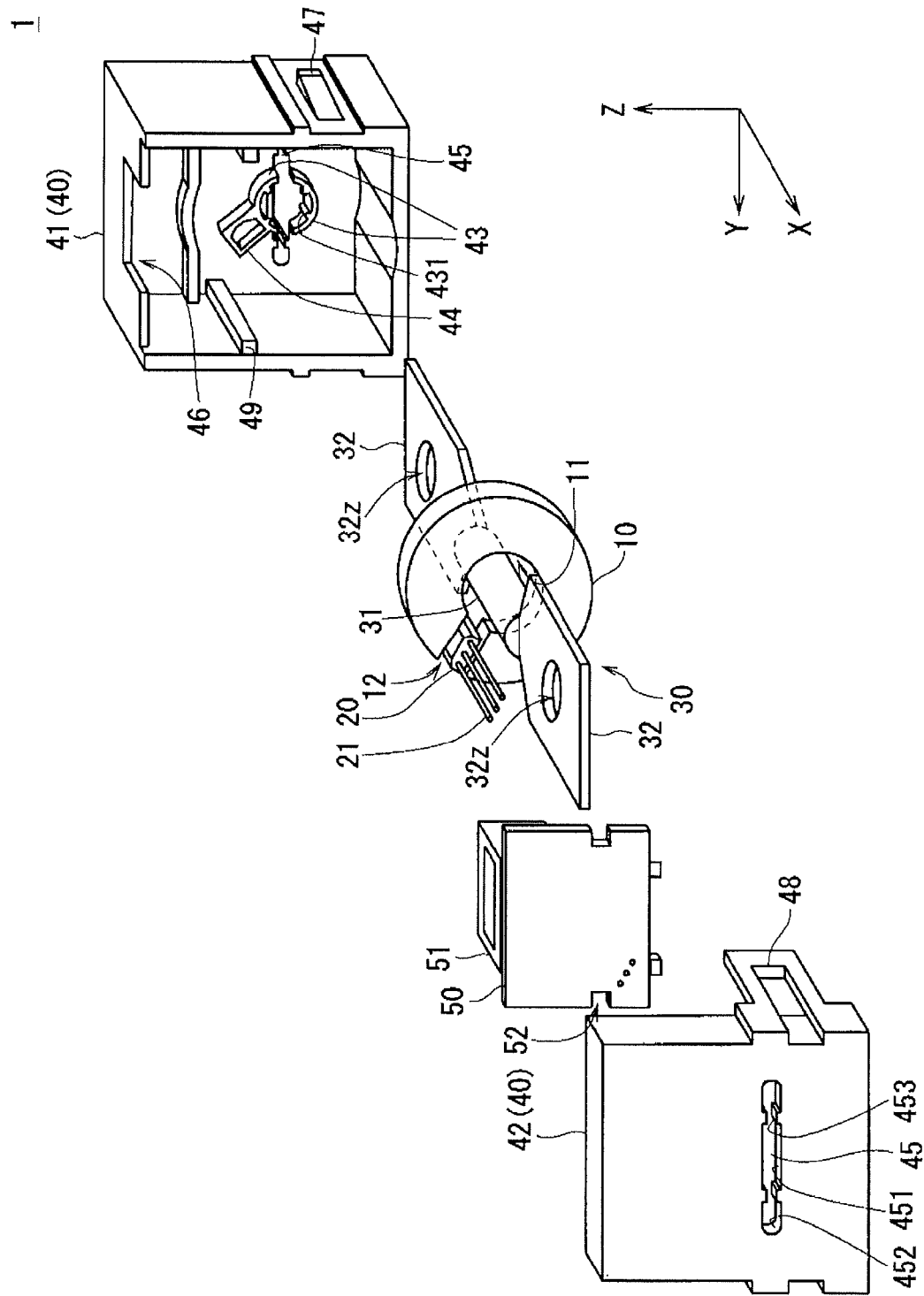
FIG. 1 shows an exploded perspective view of a current detector 1 according to an embodiment.

Hereinafter, the configuration of a current detector 1 according to an embodiment will be described with reference to FIGS. 1 to 6. The current detector 1 is an apparatus for detecting a current that flows through a busbar electrically connecting a battery and a device such as a motor, in a vehicle such as an electric automobile, a hybrid automobile, or the like. As shown in FIG. 1, the current detector 1 includes a magnetic core 10, a Hall element 20, a current detection busbar 30, an insulating casing 40, and an electronic circuit board 50.

<Magnetic Core>

The magnetic core 10, which is a magnetic material made from ferrite, silicon steel, or the like, is in a shape that has both of its two ends facing each other across a gap portion 12 with a size of approximately several millimeters, and is formed in one piece so as to surround a hole portion 11. That is to say, the magnetic core 10 is formed in the shape of a ring in conjunction with the narrow gap portion 12. The magnetic core 10 in this embodiment is in the shape of a circular ring that surrounds the circular hole portion 11 in conjunction with the gap portion 12.

<Hall Element (Magneto-Electric Conversion Element)>

The Hall element 20 is disposed in the gap portion 12 of the magnetic core 10. The Hall element 20 is an example of a magneto-electric conversion element for detecting a magnetic flux that changes in accordance with a current that passes through the hole portion 11 of the magnetic core 10, and then outputting a detection signal of the magnetic flux as an electrical signal.

In this embodiment, the Hall element 20 is a lead wire-type IC that has lead wires 21 extending from a main body portion. The lead wires 21 include a lead wire for inputting electric power and a lead wire for outputting a detection signal. It also is conceivable that the Hall element 20 is a surface mount IC.

The Hall element 20 is disposed so that a detection center point that is defined in the main body portion in advance is located at a center point of the gap portion 12 of the magnetic core 10, and the front and back surfaces of the main body portion are orthogonal to the direction of the magnetic flux that is formed in the gap portion 12. In an ideally disposed state, the Hall element 20 is in a state in which its detection center point is located on a line connecting the centers of planes of projection of the two end portions of the magnetic core 10 that face each other.

<Electronic Circuit Board>

The electronic circuit board 50 is a printed circuit board on which the portions of the lead wires 21 of the Hall element 20 are mounted. In addition to the Hall element 20, a circuit that performs processing, for example, amplification of the detection signal of the magnetic flux output from the Hall element 20 and a connector 51 are mounted on the electronic circuit board 50.

The connector 51 is a component to which a counterpart connector that is provided on a wire, which is not shown, is connectable. Furthermore, the electronic circuit board 50 is equipped with circuits for electrically connecting the lead wires 21 of the Hall element 20 to terminals of the connector 51. For example, the electronic circuit board 50 is equipped with a circuit for supplying power that is input from the outside via the wire and the connector 51 to the lead wire 21 of the Hall element 20, a circuit for amplifying the detection signal of the Hall element 20 and outputting the amplified signal to the terminal of the connector 51, and the like. Thus, the current detector 1 can output a current detection signal to an external circuit such as an electronic control unit through the wire with the connector that is connected to the connector 51.

<Current Detection Busbar>

The current detection busbar 30 is a conductive member made of a metal such as copper, and functions as part of a set of busbars electrically connecting a battery and an electrical device. A current that is to be detected flows through the current detection busbar 30. Furthermore, the current detection busbar 30 is a member independent of a battery-side busbar that is connected in advance to the battery and a device-side busbar that is connected in advance to the electrical device. Both ends of the current detection busbar 30 are respectively connected to the other pre-installed busbars (the battery-side busbar and the device-side busbar).

Figure 2A:
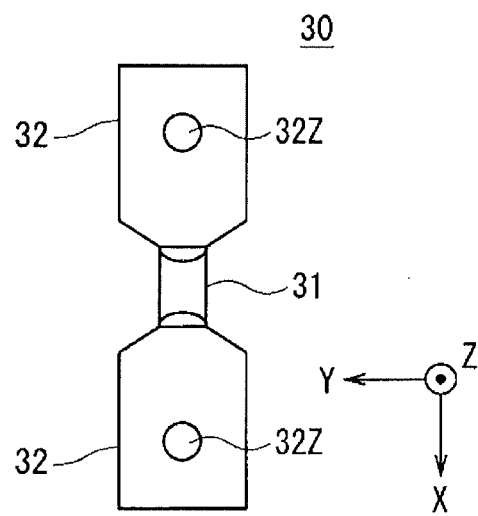
FIGS. 2(a)-(c) are a three-view drawing of a current detection busbar included in the current detector 1.
Figure 2B:
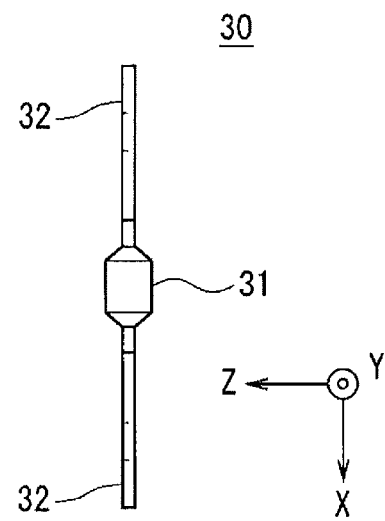
Figure 2C:
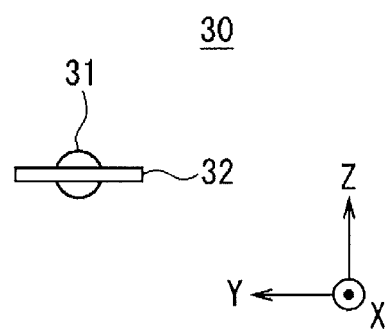

Note that in FIGS. 2(a)-(c), which are a three-view drawing of the current detection busbar 30, FIG. 2(a) shows a plan view, FIG. 2(b) shows a side view, and FIG. 2(c) shows a front view.

As shown in FIGS. 1 and 2(a)-(c), the current detection busbar 30 is composed of a member obtained by processing both end portions of a rod-shaped conductor that penetrates the hole portion 11 of the magnetic core 10. The two processed end portions of the current detection busbar 30 serve as terminal portions 32 that are respectively to be joined to upstream and downstream connection ends in a current transmission path. The current detection busbar 30 is a member composed of a conductor including a rod-shaped penetrating portion 31 that occupies a certain range at the middle of the conductor between the two end portions that occupy certain ranges from the respective ends of the conductor, and the two terminal portions 32 that are formed so as to be respectively continuous with the opposite sides of the penetrating portion 31.

The penetrating portion 31 is a portion that penetrates the hole portion 11 of the magnetic core 10 in the current flow direction. The current flow direction is the thickness direction of the magnetic core 10, is the axial direction of a cylinder when taking the ring-like magnetic core 10 as a cylinder, and is the direction orthogonal to a plane formed by the ring-like magnetic core 10. In the drawings, the current flow direction is indicated as the X-axis direction.

In the current detection busbar 30, the two terminal portions 32 have a flat plate-like shape. In addition, the penetrating portion 31 of the current detection busbar 30 is formed in the shape of a rod having, for example, a cylindrical shape, an elliptic cylindrical shape, or a prism shape.

In the current detection busbar 30 of this embodiment, the penetrating portion 31 has a cylindrical shape, and the terminal portions 32 have a flat plate-like shape. Moreover, in this embodiment, since the hole portion 11 of the magnetic core 10 has a circular shape, the contour shape of the penetrating portion 31 of the current detection busbar 30 is homothetically similar to the contour shape of the hole portion of the magnetic core 10. In the drawings, the width direction and the thickness direction of the flat plate-like terminal portions 32 are indicated as the Y-axis direction and the Z-axis direction, respectively.

The base material of the current detection busbar 30 is a member having a structure in which portions of a rod-shaped metal member that occupy certain ranges in respective ends of the rod-shaped metal member are flattened and shaped into a flat plate-like shape by press working using a pressing machine and the like.

The metal member that mainly constitutes the current detection busbar 30 is a member in the shape of a cylinder, and the penetrating portion 31 of the current detection busbar 30 that is manufactured by processing of both ends of the cylindrical metal member is in the shape of a cylinder. Note that the rod-shaped metal member that mainly constitutes the current detection busbar 30 may also be in the shape of an elliptical rod whose cross-section is an ellipse, or a square bar whose cross-section is a rectangle. Also, the rod-shaped metal member may be in the shape of a rod whose cross-section is a quadrangle or other polygons. However, it is desirable that the cross-sectional shape of the penetrating portion 31 of the current detection busbar 30 be homothetically similar to the contour shape of the hole portion 11 of the magnetic core 10.

In the current detection busbar 30, the width of each of the two terminal portions 32 is configured to be larger than the diameter (or maximum width) of the hole portion 11 of the magnetic core 10. Also, the thickness of each of the terminal portions 32 is configured to be smaller than the diameter (or thickness) of the hole portion 11. In a manufacturing process of the current detector 1, the current detection busbar 30 is connected to the other upstream and downstream busbars after a set of the magnetic core 10 and the current detection busbar 30 penetrating the hole portion 11 of that magnetic core 10 has been prepared.

In this embodiment, each of the two flat plate-like terminal portions 32 of the current detection busbar 30 has a screw through hole 32z into which a screw is inserted. The two terminal portions 32 are joined to the other upstream and downstream flat plate-like busbars via screws.

Note that it also is conceivable that the two terminal portions 32 of the current detection busbar 30 do not have the through holes 32z. In this case, the two terminal portions 32 may be joined to the other upstream and downstream busbars by crimping, spot welding, or the like.

<Insulating Casing>

The insulating casing 40 is an insulating member that holds and supports the magnetic core 10, the current detection busbar 30, and the electronic circuit board 50 on which the Hall element 20 and the connector 51 are mounted in a fixed positional relationship. The insulating casing 40 includes two members that are combined with each other from opposite sides of the magnetic core 10, namely, a casing main body 41 and a cover member 42 that is attached to the casing main body 41. The casing main body 41 and the cover member 42 are, for example, each a monolithic molded member made of insulating resin such as polyamide (PA), polypropylene (PP), or ABS resin. Note that the casing main body 41 and the cover member 42 are an example of the casing constituents.

The casing main body 41 is in the shape of a box having an opening portion. The cover member 42 covers the opening portion of the casing main body 41 when attached to the casing main body 41. Also, the casing main body 41 and the cover member 42 have busbar holes 45, which are the through holes into which the respective terminal portions 32 of the current detection busbar 30 are inserted from the internal side to the external side. One of the terminal portions 32 of the current detection busbar 30 is passed through the busbar hole 45 of the casing main body 41, and the other terminal portion 32 is passed through the busbar hole 45 of the cover member 42.

Furthermore, the cover member 42 is attached to the casing main body 41 holding the magnetic core 10, the Hall element 20, and the current detection busbar 30 such that the cover member 42 covers the opening portion of the casing main body 41 while sandwiching the magnetic core 10, the Hall element 20, and the electronic circuit board 50 including the connector 51 therebetween. At this time, the other terminal portion 32 of the current detection busbar 30 is passed through the busbar hole 45 of the cover member 42 from the internal side to the external side. The electronic circuit board 50 is sandwiched and held between the casing main body 41 and the cover member 42.

Figure 4:
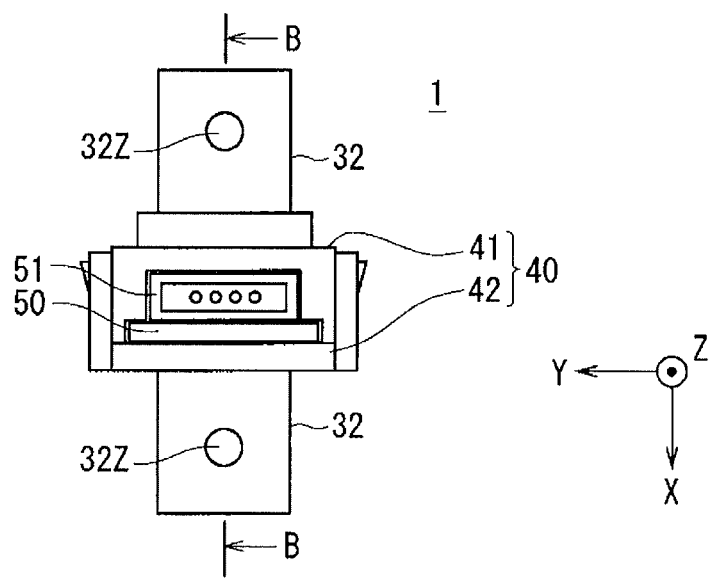
FIG. 4 shows a plan view of the current detector 1.

FIG. 4 shows a plan view of the current detector 1 in a state in which the casing main body 41 and the cover member 42 are combined with each other. As shown in FIG. 4, the casing main body 41 and the cover member 42 (the insulating casing 40) support the magnetic core 10, the Hall element 20, and the current detection busbar 30 in the fixed positional relationship while sandwiching the magnetic core 10 and the electronic circuit board 50 therebetween in a state in which the terminal portions 32 of the current detection busbar 30 and the connector 51 of the electronic circuit board 50 are exposed to the outside.

More specifically, the positions of the magnetic core 10 and the Hall element 20 within the insulating casing 40 in a direction that is parallel to a plane (X-Z plane) that is orthogonal to the current flow direction (X-axis direction) are held by core supporting portions 43 and an element supporting portion 44. Note that in FIG. 3, portions corresponding to the core supporting portions 43 and the element supporting portion 44 are indicated by a dot pattern.

Furthermore, the position of the magnetic core 10 in the current flow direction (X-axis direction) is held by the magnetic core 10 being sandwiched between the casing main body 41 and the cover member 42. Similarly, the position of the Hall element 20 that is secured to the electronic circuit board 50 in the current flow direction (X-axis direction) is held by the electronic circuit board 50 being sandwiched between the casing main body 41 and the cover member 42.

Figure 3:
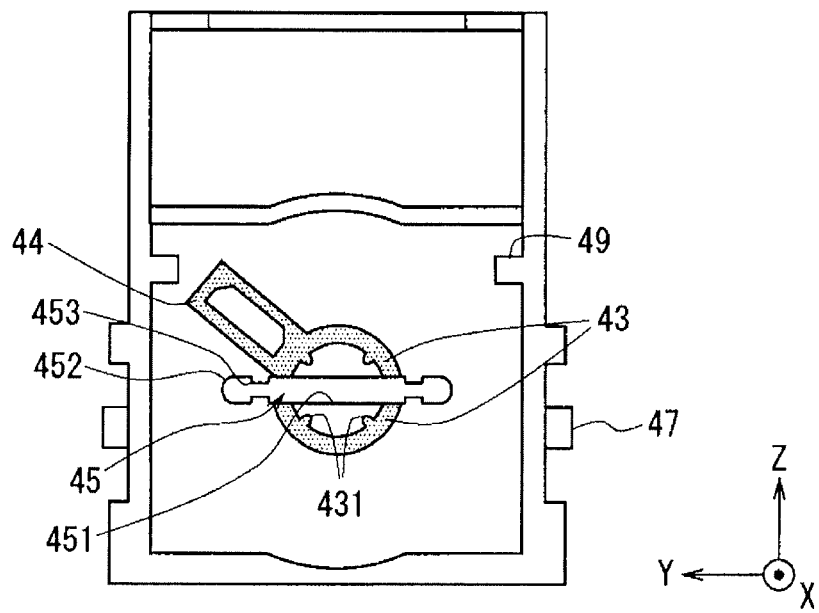
FIG. 3 shows a front view of a casing main body of a casing included in the current detector 1.

Moreover, as shown in FIGS. 1 and 3, a circuit board supporting portion 49 is formed so as to protrude from an internal side face of a side wall of the casing main body 41. The circuit board supporting portion 49 is fitted to a cut-out portion 52 that is formed in the electronic circuit board 50, and supports the electronic circuit board 50 in a predetermined position.

Furthermore, the casing main body 41 and the cover member 42 are provided with lock mechanisms 47 and 48 that hold the casing main body 41 and the cover member 42 in a state in which they are combined with each other. The lock mechanisms 47 and 48 shown in FIG. 1 are respectively configured as a catch portion 47 that is formed so as to project from a side face of the casing main body 41 and a ring-shaped frame portion 48 that is formed on a side face of the cover member 42. When the catch portion 47 of the casing main body 41 is fitted to the hole defined by the frame portion 48 of the cover member 42, the casing main body 41 and the cover member 42 are held in a state in which they are combined with each other.

Figure 6:
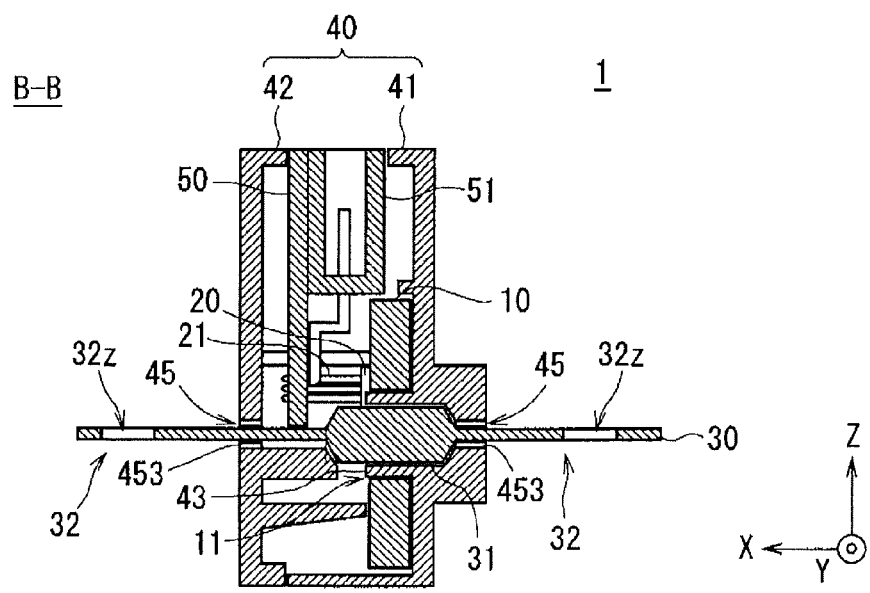
FIG. 6 shows a cross-sectional view of the current detector 1 as seen from a direction that is orthogonal to a current flow direction.

Hereinafter, with reference to FIGS. 1, 3, and 6, the structure by which the casing main body 41 supports the magnetic core 10 and the Hall element 20 will be described. Note that FIG. 6 shows a cross-sectional view taken along plane B-B of the plan view shown in FIG. 4.

As shown in FIGS. 1 and 3, the core supporting portions 43 and the element supporting portion 44 that protrude in the current flow direction (X-axis direction) are formed on an internal side face of the casing main body 41, which is one of the two members constituting the insulating casing 40.

The core supporting portions 43 are formed so as to protrude from the internal side face of the casing main body 41 at a plurality of separated positions along an edge portion of the busbar hole 45. In this embodiment, two core supporting portions 43 are formed at two positions on opposite sides of a slot-shaped gap through which the terminal portion 32 can be passed in such a manner that the two core supporting portions 43 face each other.

An internal side face of the core supporting portions 43, which is a face that faces the penetrating portion 31 of the current detection busbar 30, is formed in a shape that conforms to the outer circumferential surface of the penetrating portion 31 of the current detection busbar 30. Also, an external side face of the core supporting portions 43, which is a face that faces the magnetic core 10, is formed in a shape that conforms to the inner circumferential surface of the magnetic core 10 that forms the hole portion 11. The core supporting portions 43 are inserted in the hole portion 11 of the magnetic core 10 and support the magnetic core 10, and the core supporting portions 43 also position the magnetic core 10 in a state in which the core supporting portions 43 are sandwiched between the magnetic core 10 and the penetrating portion 31 of the current detection busbar 30.

Moreover, three or more projecting portions 431 that are plastically deformable under the pressure applied by the magnetic core 10 and the penetrating portion 31 of the current detection busbar 30 sandwiching the projecting portions 431 are formed on the internal side face of the core supporting portions 43. Each of the projecting portions 431 is formed so as to extend in the current flow direction (X-axis direction), that is, the direction in which the current detection busbar 30 penetrates the busbar holes 45.

Moreover, the projecting portions 431 are formed at three or more positions on the internal side face of the core supporting portions 43 so as to sandwich the penetrating portion 31 of the current detection busbar 30. When the three or more projecting portions 431 are provided, the core supporting portions 43 stably support the magnetic core 10 with only the projecting portions 431. In the example shown in FIG. 3, two pairs of projecting portions 431 are provided, the projecting portions 431 of each pair facing each other across the penetrating portion 31 of the current detection busbar 30.

In the casing main body 41, in a state prior to the insertion of the penetrating portion 31 of the current detection busbar 30 into the busbar hole 45—that is, in a natural state—the core supporting portions 43, which support the magnetic core 10, is provided in a state in which a little gap (or play) is created between each core supporting portion 43 and the magnetic core 10. Then, in a state in which the core supporting portions 43 are inserted between the magnetic core 10 and the current detection busbar 30 in the hole portion 11 of the magnetic core 10, the core supporting portions 43 elastically deform outward under the pressure applied by the current detection busbar 30, and come into close contact with the inner circumferential surface of the magnetic core 10. The current detection busbar 30 functions as a wedge for bringing the core supporting portions 43 into close contact with the magnetic core 10.

In the current detector 1 that has the above-described structure, a phenomenon in which the magnetic core 10 and the core supporting portions 43 repeatedly collide in an environment in which they are subjected to vibrations of the vehicle or the like does not occur. The magnetic core 10 and the core supporting portions 43 are unlikely to wear down due to the vibrations. Consequently, the current detector 1 is more durable than a conventional current detector in which a gap is formed between the magnetic core 10 and a portion that supports the magnetic core 10.

Also, since the internal side face of the core supporting portions 43 has the projecting portions 431 made of resin, the dimensional tolerances of the current detection busbar 30, the core supporting portions 43, and the magnetic core 10 are accommodated by the extent of plastic deformation of the projecting portions 431. Thus, it is possible to avoid a situation in which the core supporting portions 43 cannot be inserted in the gap between the magnetic core 10 and the current detection busbar 30 due to the dimensional tolerances.

Meanwhile, the element supporting portion 44 is formed in one piece so as to surround the perimeter of the Hall element 20 that is disposed in the gap portion 12 of the magnetic core 10. The space surrounded by the element supporting portion 44 is the space to which the Hall element 20 is fitted, in the gap portion 12 of the magnetic core 10. When the Hall element 20 is fitted to the internal space of the element supporting portion 44, the element supporting portion 44 holds the Hall element 20 in a predetermined position within the gap portion 12.

Also, in this embodiment, the element supporting portion 44 is formed in one piece with one of the plurality of core supporting portions 43. This reduces deviations of the relative positions of the core supporting portions 43 and the element supporting portion 44, resulting in an increase in the accuracy of positioning the magnetic core 10 and the Hall element 20 relative to each other.

<Description of Details of Busbar Holes>

Next, details of the busbar holes 45 that are formed in the insulating casing 40 will be described with reference to FIG. 5.

The casing main body 41 and the cover member 42 have the respective busbar holes 45 that are penetrated by the corresponding terminal portions 32 of the current detection busbar 30. The edge portion of each busbar hole 45 of the insulating casing 40 is constituted by flat surfaces 451, projecting portions 453, and curved surfaces 452.

The flat surfaces 451 constituting the edge portion of the busbar hole 45 are flat surfaces that face the terminal portion 32 with a gap left between each flat surface 451 and the terminal portion 32. The flat surfaces 451 are formed so as to be parallel to the surface of the terminal portion 32 at least in regions where the individual flat surfaces 451 face the front or back surface of the terminal portion 32.

The plurality of projecting portions 453 constituting the edge portion of the busbar hole 45 are portions that project from the flat surfaces 451 and sandwich the terminal portion 32 while coming into contact with the front or back surface of the terminal portion 32. In the example shown in FIG. 5, two pairs of projecting portions 453 are formed, the projecting portions 453 of each pair facing each other across the terminal portion 32. However, a case where only one pair of projecting portions 453 is formed is also conceivable.

As a result of the plurality of projecting portions 453 sandwiching the terminal portions 32 of the current detection busbar 30, even when the current detector 1 is subjected to vibrations, relative displacement of the insulating casing 40 and the terminal portions 32 due to the vibrations does not occur. Moreover, the plurality of projecting portions 453 also function as rotation stopping portions that prevent the insulating casing 40 from rotating around the current detection busbar 30.

The curved surfaces 452 constituting the edge portion of the busbar hole 45 are surfaces that face respective corner portions of the terminal portion 32 with a gap left between each curved surface 452 and the corresponding corner portion, and are formed so as to be curved without having corners. The shape that is formed by the flat surfaces 451 excluding the projecting portions 453 and the curved surfaces 452 is a shape that is obtained by rounding corner portions of a rectangle.

<Current Detection Busbar According to Modification>

Figure 7:
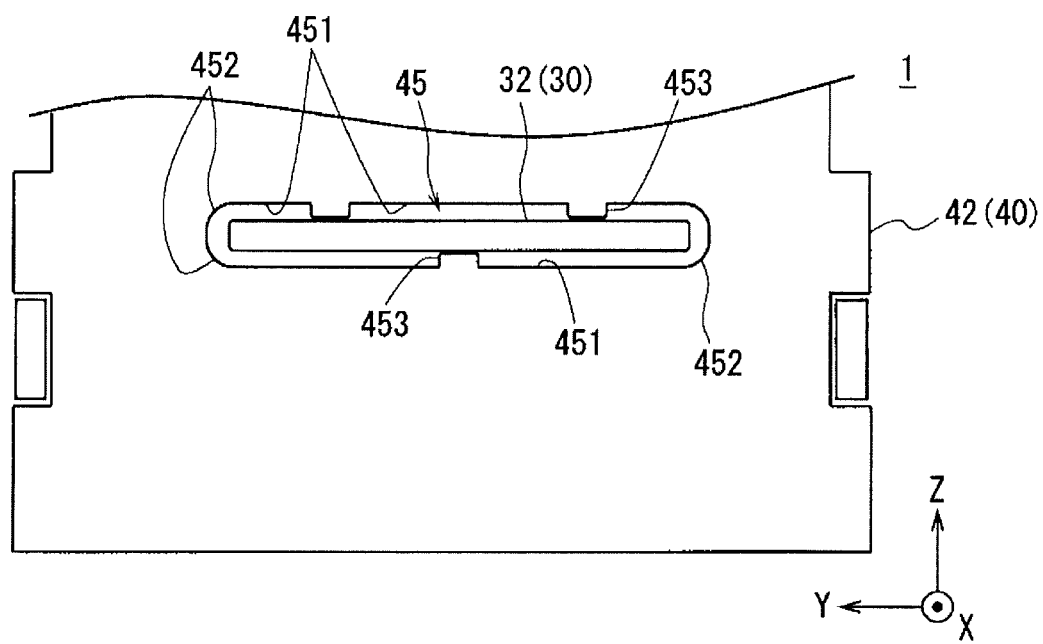
FIG. 7 shows a front view of a busbar hole portion of an insulating casing that is applicable to the current detector 1.

Next, a busbar hole 45 portion of an insulating casing 40 according to a modification that is applicable to the current detector 1 will be described with reference to FIG. 7. FIG. 7 shows a front view of a busbar hole 45 portion of the insulating casing 40 that is applicable to the current detector 1.

Figure 5:
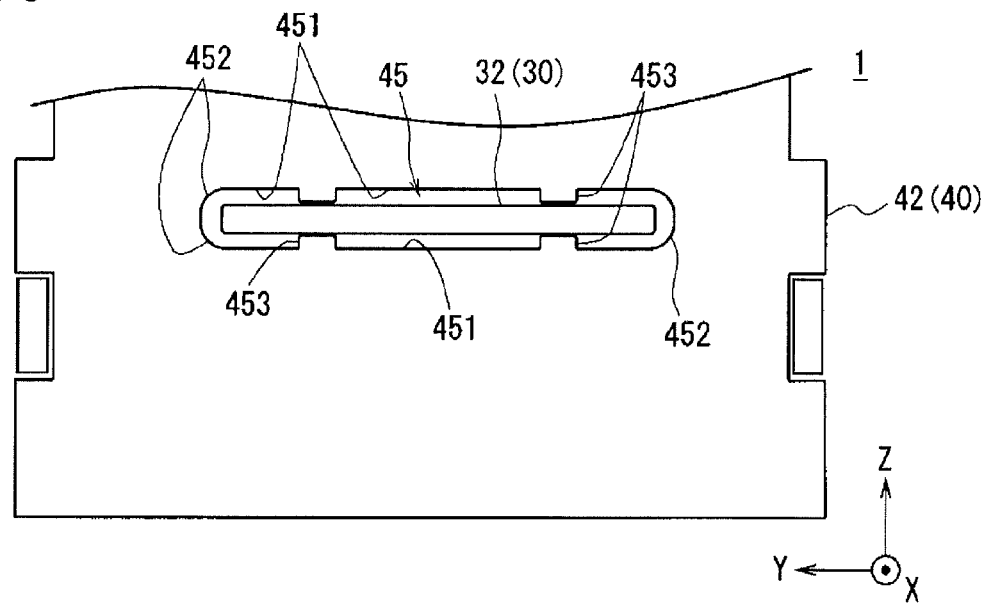
FIG. 5 shows a front view of a busbar hole portion of the insulating casing of the current detector 1.

In the example shown in FIG. 5, the plurality of projecting portions 453 are formed in positions facing one another across the terminal portion 32. On the other hand, in the example shown in FIG. 7, a projecting portion 453 that comes into contact with one side of the terminal portion 32 of the current detection busbar 30 and a projecting portion 453 that comes into contact with the other side of the terminal portion 32 are formed in positions that do not face each other. In the example shown in FIG. 7, two projecting portions 453 that come into contact with one side of the terminal portion 32 and a single projecting portion 453 that comes into contact with the other side of the terminal portion 32 are formed. However, a case where a plurality of projecting portions 453 are formed with respect to each of the two sides of the terminal portion 32 is also conceivable.

In the example shown in FIG. 7, relative displacement of the insulating casing 40 and the terminal portions 32 due to the vibrations does not occur as well. Moreover, the plurality of projecting portions 453 also function as rotation stopping portions that prevent the insulating casing 40 from rotating around the current detection busbar 30.

<Effects>

In the current detector 1, the two end portions of the current detection busbar 30 serve as the terminal portions 32. That is to say, the current detection busbar 30 penetrating the hole portion 11 of the magnetic core 10 can be joined to the pre-installed upstream and downstream busbars. Thus, it is possible to employ a current detection busbar 30 having a specific shape that is different from the shape of the upstream and downstream busbars. This makes it possible to employ a small magnetic core 10 without being restricted by the width of the upstream and downstream busbars.

Moreover, in the current detection busbar 30, the penetrating portion 31 that penetrates the hole portion 11 of the magnetic core 10 is formed so as to be thicker than the terminal portions 32 that are respectively located upstream and downstream of and are continuous with the penetrating portion 31. Thus, the penetrating portion 31 can be formed so as to have a larger cross-sectional area, with the restriction that the width and thickness of the penetrating portion 31 are smaller than the width of the hole portion 11 of the magnetic core 10. Therefore, even if a relatively small magnetic core 10 is employed, it is possible to prevent the current detection busbar 30 from excessively generating heat.

Moreover, in the current detector 1, the busbar holes 45 of the insulating casing 40 have such a large thickness that a gap is formed between each busbar hole 45 and the corresponding terminal portion 32 of the current detection busbar 30, and furthermore have no corner portions. Thus, in the edge portions of the busbar holes 45 of the insulating casing 40, cracking due to stress concentration is unlikely to occur.

Moreover, in the current detector 1, the plurality of projecting portions 453 that sandwich the terminal portions 32 of the current detection busbar 30 while coming into contact with the front and back surfaces of the terminal portions 32 are formed at the edges of the busbar holes 45 of the insulating casing 40. Thus, the edge portions of the busbar holes 45 of the insulating casing 40 and the terminal portions 32 of the current detection busbar 30 do not collide even in an environment in which they are subjected to vibrations, and the generation of an unusual sound and the wearing down of the insulating casing 40 are avoided.

Also, in the current detector 1, the core supporting portions 43 support the magnetic core 10 and the current detection busbar 30 in a state in which the core supporting portions 43 are sandwiched between the magnetic core 10 and the current detection busbar 30. In this case, even if the core supporting portions 43 are provided in a state in which a little gap (or play) is created between the magnetic core 10 and each of the core supporting portions 43, when the core supporting portions 43 are inserted between the magnetic core 10 and the penetrating portion 31 of the current detection busbar 30 in the hole portion 11 of the magnetic core 10, the core supporting portions 43 elastically deform under the pressure applied by the current detection busbar 30 and come into close contact with the inner circumferential surface of the magnetic core 10. Therefore, a phenomenon in which the magnetic core 10 and the core supporting portions 43 repeatedly collide in an environment in which they are subjected to vibrations of the vehicle or the like does not occur, and the magnetic core 10 and the core supporting portions 43 are unlikely to wear down due to the vibrations.

Also, the projecting portions 431 that are formed on the core supporting portions 43 plastically deform under the pressure applied by the magnetic core 10 and the penetrating portion 31 of the current detection busbar 30 sandwiching the projecting portions 431. Thus, the dimensional tolerances of the current detection busbar 30, the core supporting portions 43, and the magnetic core 10 are accommodated by the extent of the plastic deformation of the projecting portions 431. Therefore, it is possible to avoid a situation in which the core supporting portions 43 cannot be inserted into the gap between the magnetic core 10 and the current detection busbar 30 due to the dimensional tolerances.

Also, since the contour shape of the penetrating portion 31 of the current detection busbar 30 is homothetically similar to the contour shape of the hole portion 11 of the magnetic core 10, the gap between the current detection busbar 30 and the magnetic core 10 can be made smaller. Consequently, it is possible to downsize the current detector by employing a smaller magnetic core 10.

Also, the terminal portions 32 of the current detection busbar 30 can be easily made by press working of the rod-shaped metal member.

<Others>

In the above-described current detector 1, the three or more projecting portions 431 are formed on the internal side face of the core supporting portions 43. However, it also is conceivable that three or more similar projecting portions 431 are formed on the external side face of the core supporting portions 43. The projecting portions 431 in that case abut against the inner circumferential surface of the magnetic core 10 and plastically deform under the pressure applied by the magnetic core 10 and the current detection busbar 30 sandwiching the projecting portions 431.

Moreover, in the above-described embodiment, the magnetic core 10 is formed so as to have a circular ring-like shape in conjunction with the gap portion 12. However, the magnetic core 10 may also have other shapes. For example, it is conceivable that the magnetic core 10 has a polygonal ring-like shape in conjunction with the gap portion 12, and the cross-sectional shape of the penetrating portion 31 of the current detection busbar 30 is a polygon that is homothetically similar to the polygon defined by the hole portion 11 of the magnetic core 10. In this case, the internal side face and the external side face of the core supporting portions 43 are formed in shapes that respectively conform to the contour shape of the outer circumferential surface of the polygonal penetrating portion 31 of the current detection busbar 30 and the contour shape of the inner circumferential surface of the polygonal magnetic core 10.

What is claimed is:

1. A current detector for detecting a current that flows through a busbar, the current detector comprising:
   a magnetic core that is made of a magnetic material and formed in one piece so as to surround a hole portion, two ends of the magnetic core facing each other across a gap portion;
   a magneto-electric conversion element that is disposed in the gap portion of the magnetic core and detects a magnetic flux that changes in accordance with a current that passes through the hole portion of the magnetic core;
   a current detection busbar that is composed of a conductor comprising a penetrating portion that penetrates the hole portion of the magnetic core and two flat plate-like terminal portions that are respectively continuous with opposite sides of the penetrating portion in a direction in which the penetrating portion penetrates the hole portion and that have a larger width and a smaller thickness than the penetrating portion; and
   an insulating casing that supports the magnetic core, the magneto-electric conversion element, and the penetrating portion of the current detection busbar in a fixed positional relationship while covering the magnetic core, the magneto-electric conversion element, and the penetrating portion of the current detection busbar in a state in which the two terminal portions are exposed to an outside, wherein the insulating casing is constituted by two casing constituents that are combined with each other from opposite sides of the magnetic core, the two casing constituents each having a busbar hole that is penetrated by the corresponding terminal portion of the current detection busbar, an edge portion of the busbar hole being constituted by flat surfaces that face the terminal portion with a gap left between each of the flat surfaces and the terminal portion, a plurality of projecting portions that project from the flat surfaces and sandwich the terminal portion while coming into contact with a front surface and a back surface of the terminal portion, and curved surfaces that face respective corner portions of the terminal portion with a gap left between each of the curved surfaces and the corresponding corner portion.

2. The current detector according to claim 1,
wherein the current detection busbar is a member having a structure in which both end portions of a rod-shaped metal member that is capable of penetrating the hole portion of the magnetic core are shaped by press working into a flat plate-like shape that is wider than other portions of the rod-shaped metal member, and the two shaped end portions constitute the two terminal portions.

* * * * *